United States Patent [19]

Fehr et al.

[11] Patent Number: 5,491,110
[45] Date of Patent: Feb. 13, 1996

[54] METAL SEMICONDUCTOR PACKAGE WITH AN EXTERNAL PLASTIC SEAL

[75] Inventors: Gerald K. Fehr, Cupertino; Victor Batinovich, Morgan Hill, both of Calif.

[73] Assignee: Integrated Packaging Assembly Corporation, San Jose, Calif.

[21] Appl. No.: 383,716

[22] Filed: Feb. 3, 1995

Related U.S. Application Data

[62] Division of Ser. No. 258,967, Jun. 13, 1994, Pat. No. 5,436,407.

[51] Int. Cl.$^6$ .................................................. H01L 21/60
[52] U.S. Cl. .......................... 437/206; 437/209; 437/214; 437/220; 437/221; 437/224
[58] Field of Search ................................ 437/206, 209, 437/221, 222, 223, 224, 219, 220

[56] References Cited

U.S. PATENT DOCUMENTS

| | | |
|---|---|---|
| 4,461,924 | 7/1984 | Butt. |
| 4,769,345 | 9/1988 | Butt et al. ............................ 437/221 |
| 4,888,449 | 12/1989 | Crane et al. . |
| 4,897,508 | 1/1990 | Mahulikar et al. . |
| 4,939,316 | 7/1990 | Mahulikar et al. . |
| 5,013,871 | 5/1991 | Mahulikar et al. . |
| 5,015,803 | 5/1991 | Makulikar et al. . |
| 5,023,398 | 6/1991 | Mahulikar et al. . |
| 5,043,534 | 8/1991 | Mahulikar et al. . |
| 5,066,368 | 11/1991 | Pasqualoni et al. . |
| 5,073,521 | 12/1991 | Braden .................................... 437/209 |
| 5,270,262 | 12/1993 | Switky et al. ........................... 437/221 |

FOREIGN PATENT DOCUMENTS 60-186028  9/1985  Japan ..................................... 437/224

*Primary Examiner*—Brian E. Hearn
*Assistant Examiner*—Kevin M. Picardat
*Attorney, Agent, or Firm*—Flehr, Hohbach, Test, Albritton & Herbert

[57] ABSTRACT

An improved metal semiconductor package is described. The semiconductor package includes a lead frame with a top side and a bottom side. A semiconductor is positioned on the top side of the lead frame. Bond wires electrically couple the lead frame to the semiconductor die. A metallic base is positioned at the bottom side of the lead frame. A metallic cap is positioned over the top side of the lead frame. The metallic cap includes a central aperture that is aligned with the semiconductor die. An external plastic seal is used to join the metallic base, lead frame, and metallic cap. The external plastic seal may be in the form of a perimeter seal or a body seal.

13 Claims, 2 Drawing Sheets

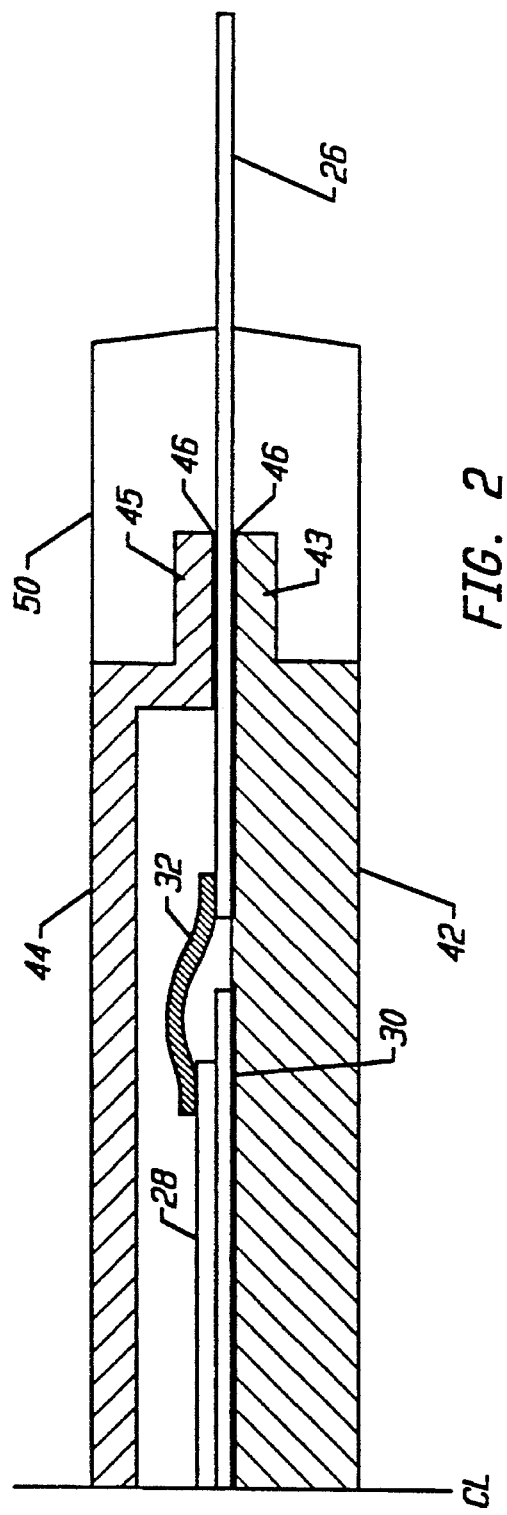
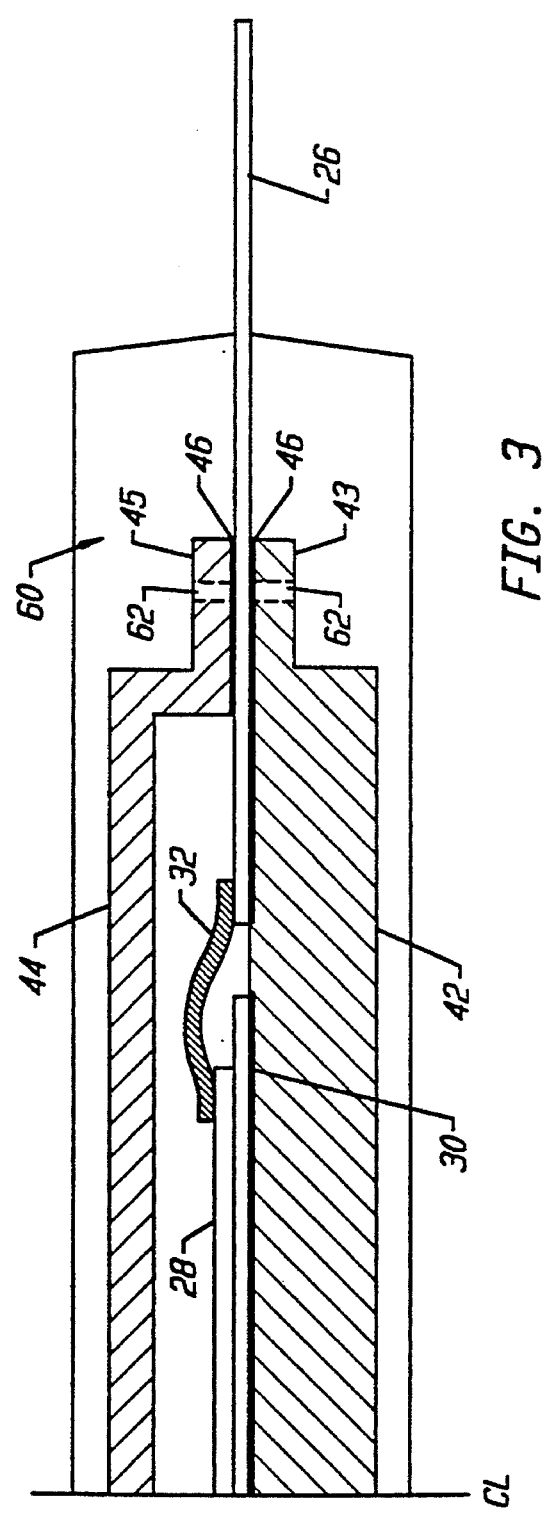

METAL SEMICONDUCTOR PACKAGE WITH AN EXTERNAL PLASTIC SEAL

This is a division of application Ser. No. 08/258,967 filed Jun. 13, 1994 now U.S. Pat. No. 5,436,407.

BRIEF DESCRIPTION OF THE INVENTION

This invention relates generally to the packaging of semiconductors. More particularly, this invention relates to a metal semiconductor package that is sealed with an external plastic seal.

BACKGROUND OF THE INVENTION

Packages for housing semiconductors are well known in the art. However, there are ongoing efforts to improve a variety of parameters associated with semiconductor packages. Important semiconductor package parameters that require optimization include thermal dissipation, die stress, package hermeticity, and package cost. A number of these factors are addressed in a set of patents (U.S. Pat. Nos. 4,888,449; 4,897,508; 5,023,398; 5,073,521; 5,013,871; 4,939,316; 4,461,924; 5,015,803; 5,043,534; 5,066,368) issued to the Olin Corporation of New Haven, Conn. Each of the foregoing patents is expressly incorporated by reference herein. The recited patents describe techniques for packaging semiconductors in a metal housing.

FIG. 1 illustrates one technique for packaging a semiconductor in a metal housing. Specifically, FIG. 1 illustrates a metal semiconductor package 20 with an internal adhesive seal. The package 20 includes a metal base 22 formed of a metal material such as anodized aluminum. The package 20 also includes a metal cap 24, which may also be formed of anodized aluminum. A standard lead frame 26 is positioned between the base 22 and the cap 24.

Prior to positioning the cap 24 over the lead frame 26, standard techniques are used to couple a semiconductor die 28 to the base 22 with a die adhesive 30 (in an alternate configuration, the semiconductor die 28 can be connected to the lead frame 26). Afterwards, in accordance with any of a number of well known techniques, bond wires 32 are connected between lead fingers of the lead frame 26 and bond pads (not shown) of the semiconductor die 28.

An internal adhesive seal 34 is used to couple the base 22 and the cap 24. In particular, a base-lead frame seal 34A is used to couple the base 22 to the lead frame 26, and a cap-lead frame seal 34B is used to couple the cap 24 to the lead frame 26.

There are a number of problems associated with the metal semiconductor packages of the type illustrated in FIG. 1. For example, the semiconductor die 28 will only be protected if a perfect adhesive seal is formed. A perfect seal is difficult to obtain in most commercial processes. For instance, difficulties may arise when the base 22 and the cap 24 are of slightly different sizes or planarity, thereby resulting in a sealing mismatch. In addition, it is difficult to insure that the adhesive is uniformly applied along the perimeter of the base 22 or cap 24. Refinements in the manufacturing process to improve alignment, to diminish discrepancies in base and cap sizes, or to improve the uniformity of adhesive application result in increased expense. Also adding to the expense associated with prior art metal semiconductor packages utilizing internal adhesive seals is the requirement that they be tested to insure that an environment-retarding seal has actually been obtained. As used herein, the term environment-retarding seal refers to a substantial barrier to moisture and gases. An environment-retarding seal is not as complete as the hermetic seal provided by metal, glass, or a ceramic material.

SUMMARY OF THE INVENTION

The semiconductor package of the invention includes a lead frame with a top side and a bottom side. A semiconductor is positioned on the top side of the lead frame. Bond wires electrically couple the lead frame to the semiconductor die. A metallic base is positioned at the bottom side of the lead frame. A metallic cap is positioned over the top side of the lead frame. The metallic cap includes a central aperture that is aligned with the semiconductor die. An external plastic seal is used to join the metallic base, lead frame, and metallic cap. The external plastic seal may be in the form of a perimeter seal or a body seal.

BRIEF DESCRIPTION OF THE DRAWINGS

For a better understanding of the invention, reference should be made to the following detailed description taken in conjunction with the accompanying drawings, in which:

FIG. 2 is a cross-sectional view of a metal semiconductor package with an external perimeter plastic seal.

FIG. 3 is a cross-sectional view of a metal semiconductor package with an external plastic body seal and through-hole flanges.

Like reference numerals refer to corresponding parts throughout the several views of the drawings.

DETAILED DESCRIPTION OF THE INVENTION

Figure 1:
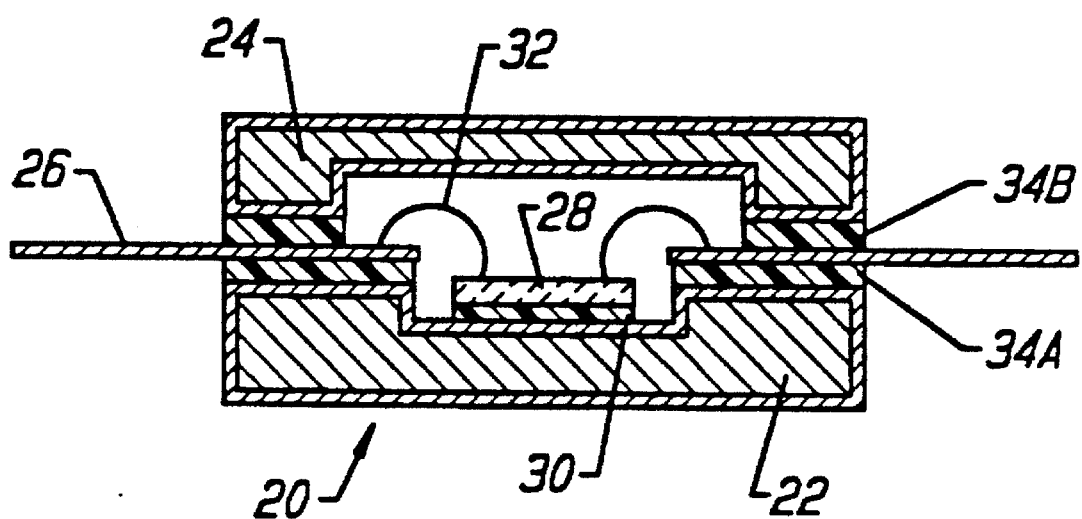
FIG. 1 illustrates a prior art metal semiconductor package with an internal adhesive seal.

FIG. 2 is a cross-sectional view of one embodiment of a metal semiconductor package formed in accordance with the present invention. The package includes a number of known elements previously described in relation to FIG. 1, and thereby indicated in FIG. 2 with identical reference numbers.

The apparatus of FIG. 2 includes a novel flange perimeter base 42. That is, the base 42 includes a base flange 43, preferably formed around the entire perimeter of the base 42. The apparatus also includes a flange perimeter cap 44 that has a cap flange 45, preferably formed around the entire perimeter of the cap 44.

The apparatus of FIG. 2 also includes a coupling adhesive 46. However, the coupling adhesive 46 departs from the adhesives used in the prior art because it does not need to form an environment-retarding seal. The coupling adhesive 46 of the invention merely needs to mechanically couple (1) the flange perimeter base 42 to the lead frame 26, and (2) the flange perimeter cap 44 to the lead frame 26. Since a mechanical coupling is sufficient, and an environment-retarding seal is not required, the adhesive of the invention may be applied without observing the exacting requirements associated with prior art metal semiconductor packages. This reduces the expense of manufacturing the package.

An environment-retarding seal for the package of FIG. 2 is obtained with a perimeter plastic seal 50. Standard plastic packaging equipment and technology are used to form the seal 50. As illustrated in FIG. 2, the perimeter plastic seal 50 holds the base flange 43 and the cap flange 45 together. The figure also illustrates that the lead frame 26 projects through the perimeter plastic seal 50. The perimeter plastic seal 50 is formed around the entire perimeter of the package.

Those skilled in the art will appreciate that the perimeter plastic seal 50 of the invention provides a relatively easy and inexpensive way to provide an environment-retarding seal. In addition, the perimeter plastic seal 50 obviates the problems associated with prior art internal adhesive seals 34.

FIG. 3 depicts an alternate embodiment of the invention. One difference between the device of FIG. 2 and the device of FIG. 3 is that the device of FIG. 3 is completely enclosed with an external plastic body seal 60. Standard plastic packaging equipment and technology may be used to form the body seal 60. Another difference between the device of FIG. 2 and the device of FIG. 3 is that the flanges 43 and 45 include through-holes 62 to provide a stronger mechanical coupling. That is, the adhesive 46 is allowed to enter the through-holes 62 to provide additional bonding surface area. The flanges 43 and 45 may also have a textured surface to strengthen their coupling with adhesive 46.

Those skilled in the art will recognize a number of benefits associated with the semiconductor packages of the invention. First, the packages of the invention enjoy the benefits concomitant with metal semiconductor packages, such as excellent thermal dissipation and reduced die stress. On the other hand, the packages of the invention do not suffer from the problems typically associated with metal semiconductor packages. In particular, the packages of the invention can be formed without strict sizing tolerance for the base and cap. In addition, strict tolerances are not necessary for the adhesive. The external plastic seal of the invention provides an efficient technique for achieving an environment-retarding sealed metal semiconductor package. Since the external plastic seal is so efficient in sealing the semiconductor package, it usually will not be necessary to test the quality of the seal, as required in prior art metal semiconductor packages. The foregoing considerations result in a metal semiconductor package that can be manufactured at a substantially reduced price.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Alternate embodiments of the invention are readily appreciated. For example, the invention may be implemented by using a recessed region within the base 42. Such a structure is shown in FIG. 1. In this embodiment, the die 28 is directly attached to the base 42, instead of to the lead frame 26.

We claim:

1. A method of forming a semiconductor package, said method comprising the steps of:

providing a lead frame with a top surface and a bottom surface;

affixing a semiconductor die to said top surface of said lead frame;

connecting bond wires between said semiconductor die and said lead frame;

positioning a metallic base member adjacent to said bottom surface of said lead frame to allow an adhesive to directly couple said metallic base member to said bottom surface of said lead frame;

placing a metallic cap member on top of said top surface of said lead frame to allow an adhesive to directly couple said metallic cap member to said top surface of said lead frame, said metallic cap member defining a cavity over said semiconductor die; and sealing, after said placing step, said lead frame between said metallic base member and said metallic cap member with an external plastic seal.

2. The method of claim 1 wherein said sealing step includes the step of forming an external plastic seal around the perimeter of said metallic base and said metallic cap.

3. The method of claim 1 wherein said sealing step includes the step of enclosing said metallic base and said metallic cap with said external plastic seal.

4. A method of forming a semiconductor package, said method comprising the steps of:

providing a lead frame with a top surface and a bottom surface;

affixing a semiconductor die to said top surface of said lead frame;

connecting bond wires between said semiconductor die and said lead frame;

positioning a metallic base member adjacent to said bottom surface of said lead frame, said metallic base member including a perimeter flange member with a through-hole;

placing a metallic cap member on top of said top surface of said lead frame; and sealing said lead frame between said metallic base member and said metallic cap member with an external plastic seal.

5. The method of claim 4 further comprising the step of forming said metallic cap with a perimeter flange member and a through-hole.

6. The method of claim 5 further comprising the step of texturing said metallic base member and said metallic cap.

7. The method of claim 4 wherein said sealing step includes the step of forming a perimeter plastic seal around the perimeter of said metallic base and said metallic cap.

8. The method of claim 4 wherein said sealing step includes the step of forming a plastic seal enclosing said metallic base and said metallic cap.

9. A method of forming a semiconductor package, said method comprising the steps of:

providing a lead frame with a top surface and a bottom surface;

affixing a semiconductor die to said top surface of said lead frame;

connecting bond wires between said semiconductor die and said lead frame;

positioning a metallic base member adjacent to said bottom surface of said lead frame;

placing a metallic cap member on top of said top surface of said lead frame, said metallic cap member including a perimeter flange member with a through-hole; and sealing said lead frame between said metallic base member and said metallic cap member with an external plastic seal.

10. The method of claim 9 further comprising the step of forming said metallic base with a perimeter flange member and a through-hole.

11. The method of claim 10 further comprising the step texturing said metallic base member and said metallic cap.

12. The method of claim 9 wherein said sealing step includes the step of forming a perimeter plastic seal around the perimeter of said metallic base and said metallic cap.

13. The method of claim 9 wherein said sealing step includes the step of forming a plastic seal enclosing said metallic base and said metallic cap.

* * * * *